(12) United States Patent
Di Cioccio et al.

(10) Patent No.: US 8,647,983 B2
(45) Date of Patent: Feb. 11, 2014

(54) SIMPLIFIED COPPER-COPPER BONDING

(75) Inventors: Lea Di Cioccio, Saint Ismier (FR);
Pierric Gueguen, Echirolles (FR);
Maurice Rivoire, Meylan (FR)

(73) Assignees: Commissariat a l'energie atomique et aux energies alternatives, Paris (FR);
STMicroelectronics (Crolles 2) SAS, Crolles (FR)

( * ) Notice: Subject to any disclaimer, the term of this patent is extended or adjusted under 35 U.S.C. 154(b) by 37 days.

(21) Appl. No.: 13/380,595

(22) PCT Filed: Jul. 1, 2010

(86) PCT No.: PCT/EP2010/059335
§ 371 (c)(1),
(2), (4) Date: Dec. 23, 2011

(87) PCT Pub. No.: WO2011/000898
PCT Pub. Date: Jan. 6, 2011

(65) Prior Publication Data
US 2012/0100657 A1    Apr. 26, 2012

(30) Foreign Application Priority Data
Jul. 3, 2009 (FR) ...................................... 09 54608

(51) Int. Cl.
*H01L 21/44* (2006.01)
*H01L 21/50* (2006.01)

(52) U.S. Cl.
USPC .......................................... 438/687; 438/118

(58) Field of Classification Search
None
See application file for complete search history.

(56) References Cited

U.S. PATENT DOCUMENTS

| 6,265,246 B1 | 7/2001 | Ruby et al. |
| 6,376,280 B1 | 4/2002 | Ruby et al. |
| 2007/0045738 A1 * | 3/2007 | Jones et al. .................... 257/347 |
| 2007/0218585 A1 | 9/2007 | Robert |
| 2008/0001241 A1 | 1/2008 | Tuckerman et al. |
| 2008/0002460 A1 | 1/2008 | Tuckerman et al. |
| 2008/0029879 A1 | 2/2008 | Tuckerman et al. |

FOREIGN PATENT DOCUMENTS

| EP | 1 834 924 A2 | 9/2007 |
| WO | WO 2006/052763 A2 | 5/2006 |
| WO | WO 2007/028898 A1 | 3/2007 |

OTHER PUBLICATIONS

Shigetou et al., "Bumpless Interconnect of 6-um pitch Cu Electrodes at Room Temperature" Aug. 2008, Electronic Components and Technology Conference, pp. 1405-1409.*

(Continued)

*Primary Examiner* — Zandra Smith
*Assistant Examiner* — Pamela E Perkins
(74) *Attorney, Agent, or Firm* — Oblon, Spivak, McClelland, Maier & Neustadt, L.L.P.

(57) ABSTRACT

A method for bonding a first copper element onto a second copper element including forming a crystalline copper layer enriched in oxygen on each of surfaces of each of the first and second elements through which the elements will be in contact, the total thickness of both layers being less than 6 nm, which includes: a) polishing the surfaces so as to obtain a roughness of less than 1 nm RMS, and hydrophilic surfaces, b) cleaning the surfaces to suppress presence of particles due to the polishing and the major portion of corrosion inhibitors, and c) putting both crystalline copper layer enriched in oxygen in contact with each other.

15 Claims, 5 Drawing Sheets

(56) References Cited

OTHER PUBLICATIONS

Figure 1A:
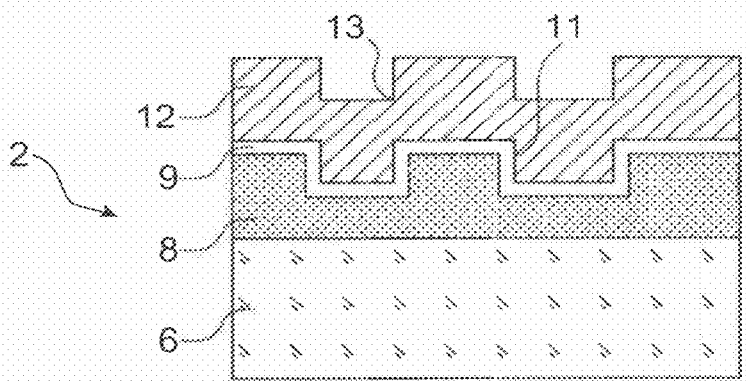

Shigetou et al., "Bumpless Interconnect Through Ultrafine Cu Electrodes by Measn of Surface-Activated Bonding (SAB) Method" May 2006, IEEE Transactions on Advanced Packaging, vol. 29, No. 2, pp. 218-226.*

Kim et al. "Room temperature Cu—Cu direct bonding using surface activated bonding method" Mar. 2003, Journal of Vacuum Science & Technology A: Vacuum, Surfaces and Films, vol. 21, Issue 2, pp. 449-453.*

U.S. Appl. No. 13/380,633, filed Dec. 23, 2011, Di Cioccio et al.

French Preliminary Search Report issued Apr. 14, 2010 in patent application No. 0954608 with English Translation of Category of Cited Documents.

Geraldine C. Schwartz, et al., "Handbook of Semiconductor Interconnection Technology", Second Edition, 2006, pp. 430-431 plus cover pages.

Jae Y. Kim, et al., "Reduction of CuO and $Cu_2O$ with $H_2$: H Embedding and Kinetic Effects in the Formation of Suboxides", J. Am. Chem. Soc. Articles, vol. 125, No. 35, 2003, pp. 10684-10692.

Pierric Gueguen, et al., "Copper direct bonding for 3D integration", Interconnect Technology Conference 2008, IITC 2008, Jun. 1-4, 2008, pp. 61-63.

Pierric Gueguen, et al., "3D Vertical interconnects by Copper Direct Bonding", MRS Fall Meeting 2008, vol. 1112, 2008, 9 pages.

Pierric Gueguen, et al., "Copper Direct Bonding Characterization and its Interests for 3D Integration Circuits", ECS Meeting, ECS Trans. 16, 31, Abstract #2167, 2008, 1 page.

Léa Di Cioccio, et al., "Enabling 3D interconnects with Metal Direct Bonding", Interconnect Technology Conference 2009, IITC 2009, IEEE International, Jun. 1-3, 2009, 3 pages.

Akitsu Shigetou, et al., "Modified Diffusion Bond Process for Chemical Mechanical Polishing (CMP)—Cu at 150° C in Ambient Air", 2009 Conference on Electronic Components and Technology, IEEE, 2009, pp. 365-369.

U.S. Appl. No. 13/811,498, filed Jan. 22, 2013, Di Cioccio.

* cited by examiner

SIMPLIFIED COPPER-COPPER BONDING

TECHNICAL FIELD AND PRIOR ART

The present invention relates to metal-metal bonding, more particularly to simplified copper-copper bonding, which may notably be used in the manufacturing of microelectronic devices.

Three-dimensional integration in microelectronic devices allows reduction in the size of the devices, reduction of their electric consumption, increase in the transmission rates, the performances, the operating frequency.

A three-dimensional integration notably includes bonding steps with alignment, thinning and vertical interconnection through the stack.

TSV (Through Silicon Via) technology is used, which consists of making connection vias through silicon. However, in order to obtain high interconnection density and to simplify the technology, it is preferable to associate them with metal-metal bonding directly.

Copper is one of the metals particularly used for making connection pads.

There exist different methods for achieving direct copper-copper bonding: by thermal compression or under ultra-vacuum, the surfaces having being activated by means of an argon plasma. With these methods it is possible to obtain good results, however they either require ultra-vacuum for preparing the surfaces, or a high temperature for carrying out the bonding, or working under a particular atmosphere. Applying pressure may damage the MEMS sensors.

Therefore an object of the present invention is to provide a novel method for direct copper-copper bonding.

DISCUSSION OF THE INVENTION

The object stated earlier is achieved by a copper-copper bonding method, including a step for generating a crystalline copper layer enriched in oxygen of a few nanometers thick on each of the faces to be put into contact and for putting both of these faces into contact, this step for generating a crystalline copper layer enriched in oxygen comprising the steps for polishing and cleaning copper surfaces.

The inventors have noticed surprisingly that the presence of a crystalline copper layer enriched in oxygen on the copper surfaces allows both surfaces to be bonded and an electrically conducting assembly to be obtained.

Advantageously, the bonding according to the present invention may be performed at room temperature under atmospheric pressure, in open air, without any adhesive, without any specific pressure and without annealing. By working at room temperature, it is possible to improve the alignment of the wafers to be bonded or of the components borne by the wafers, since the occurrence of a curvature difference between the wafers is avoided.

Provision may be made for exerting slight pressure on an edge of the stack in order to initiate the bonding.

With the method according to the present invention, proper alignment between the wafers may be obtained because of the absence of pressure upon bonding.

A subject-matter of the present invention is then a method for bonding a first copper element onto a second copper element, including at least:

A) a step for forming a crystalline copper layer enriched in oxygen on each of the surfaces of each of the first and second elements through which the elements will be in contact, the total thickness of both layers being less than 6 nm, B) a step for putting both crystalline copper layers enriched in oxygen in contact with each other,
said step A) comprising:
a) at least one step for polishing the surfaces so as to obtain a roughness of less than 1 nm RMS, and hydrophilic surfaces,
b) at least one step for cleaning said surfaces in order to suppress the presence of particles due to the polishing and the major portion of corrosion inhibitors.

Advantageously, the roughness is less than 0.5 nm RMS.

Step B) advantageously takes place at room temperature, under atmospheric pressure and in air.

Preferably, step B) takes place within two hours following step b).

The bonding method according to the invention may include a step for applying a force on one of the elements tending to bring both oxygen-enriched crystalline copper layers closer to each other so as to initiate bonding. Application of the force advantageously takes place only on one edge of one of the elements.

The dense planes of the copper elements may be oriented substantially parallel to the bonding surfaces.

The copper elements may include a substrate, a dielectric layer provided with etchings deposited on the substrate, a copper layer covering the dielectric and filling the etchings of the dielectric layer, said copper layer including steps at the etchings, wherein step a) for example includes the following sub-steps:

a1) chemical mechanical polishing of the copper layer of each element with a leveling chemical solution until the steps disappear and a substantially planar copper surface is obtained, a2) chemical mechanical polishing of the remaining copper layer with a selective non-leveling chemical solution, relatively to the dielectric until the copper on the dielectric layer outside the etchings is completely removed, the copper remaining at the same level as the dielectric or set back from the surface of the dielectric;

a3) chemical mechanical polishing of the dielectric with a leveling chemical solution until the surface of the dielectric is substantially at the surface of the pads.

The elements may include a diffusion barrier between the dielectric and the copper layer; during step a2), the copper layer is polished until it disappears on the diffusion barrier outside etchings, and during step a3), the diffusion barrier is polished before the dielectric or instead of the dielectric.

The method according to the invention may include an additional step C) for annealing after step B).

The first element is for example in the form of a copper plate or pads flush with a surface of dielectric material and the second element is in the form of a plate or pads flush with a surface of dielectric material.

The subject-matter of the present invention is also a method for manufacturing a microelectronic device comprising an electromechanical microsystem structure in a hermetically sealed cavity comprising:

a step for making a first element provided with an electromechanical microsystem structure surrounded by a first copper wall forming a closed contour, the top of said first wall being formed by a planar surface, a step for making a second element provided with a second wall, the top of which is formed by a planar face with shape and dimensions similar to that of the first wall of the first element, the sum of the heights of the first and second walls being greater than the height of the electromechanical microsystem structure, a step for polishing the planar faces of the walls of each of the first and second elements through which the elements will be in contact so as to obtain a roughness of less than 1 nm RMS, advantageously less than or equal to 0.5 nm RMS, a step for cleaning said faces in order to suppress the presence of particles due to polishing and of corrosion inhibitors, a step for contact with oxygen and for forming an oxygen-enriched crystalline copper layer on each of the planer faces, the total thickness of both layers being less than 6 nm, a step for putting both crystalline copper layers enriched in oxygen in contact with each other so as to seal the electromechanical microsystem structure in a sealed cavity delimited by the first and second elements and the first and second walls.

The method may include a step for controlling the atmosphere within the thereby formed cavity. The contact step is advantageously carried out under vacuum.

SHORT DESCRIPTION OF THE DRAWINGS

Figure 1B:
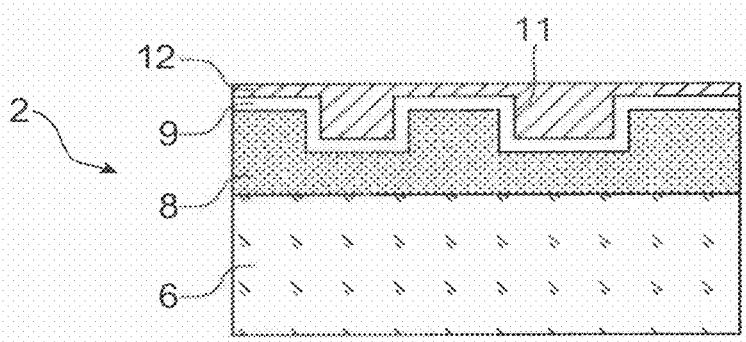
Figure 1C:
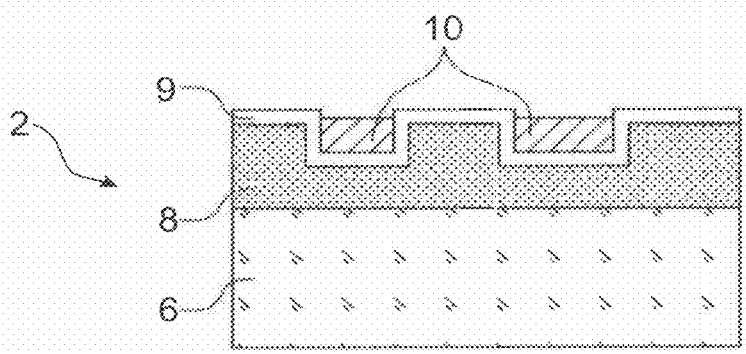
Figure 1D:
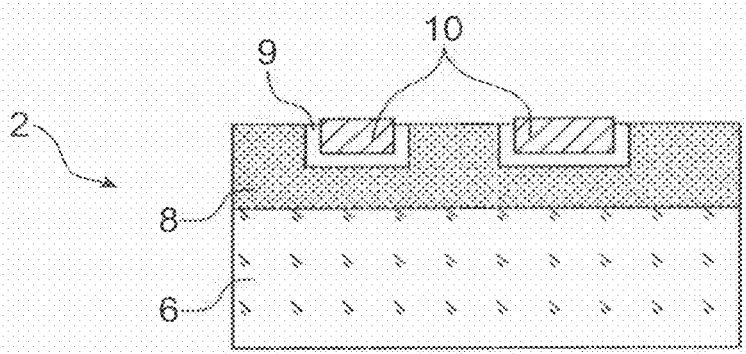
Figure 1E:
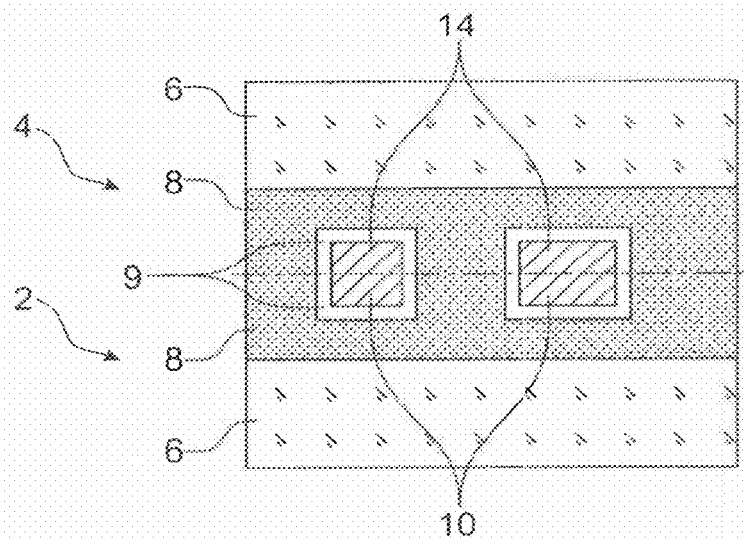
Figure 2:
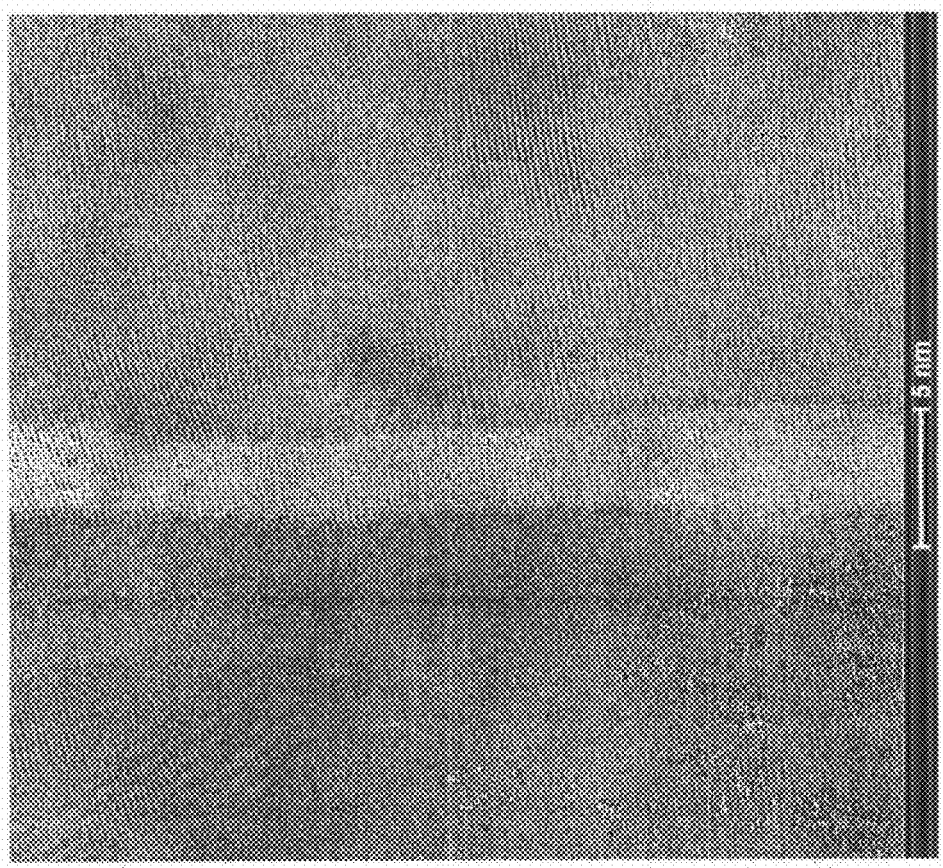
Figure 3:
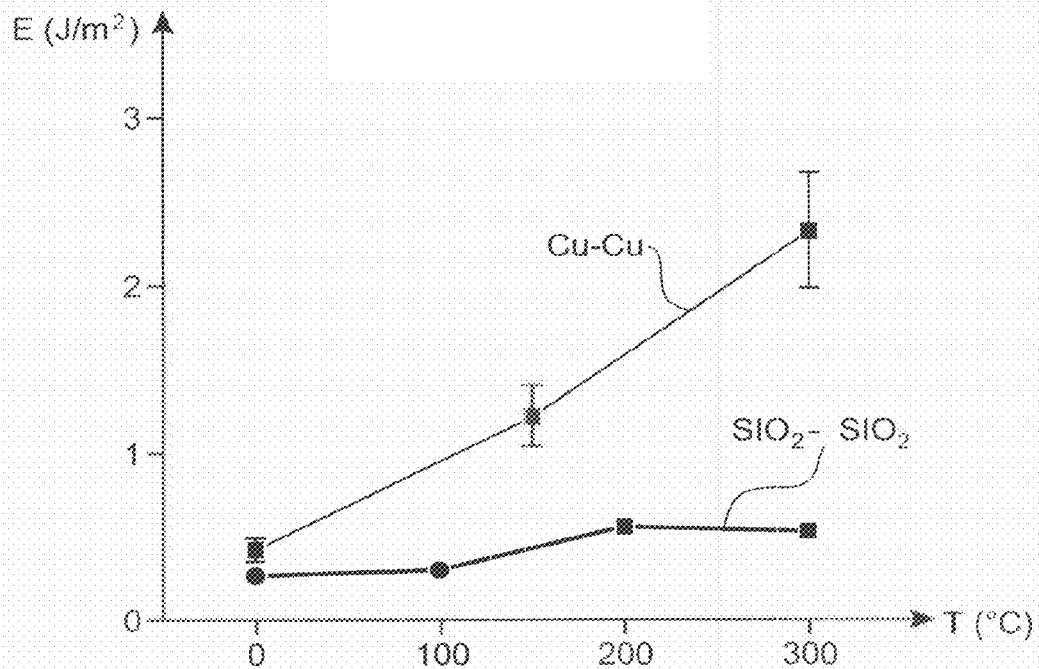
Figure 4:
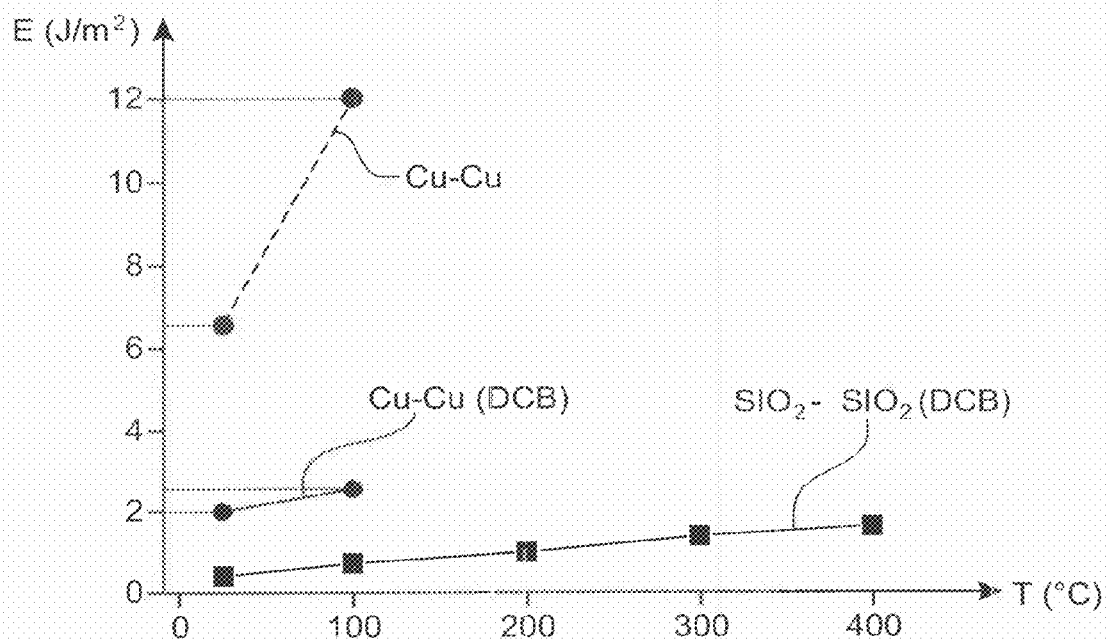
Figure 5A:
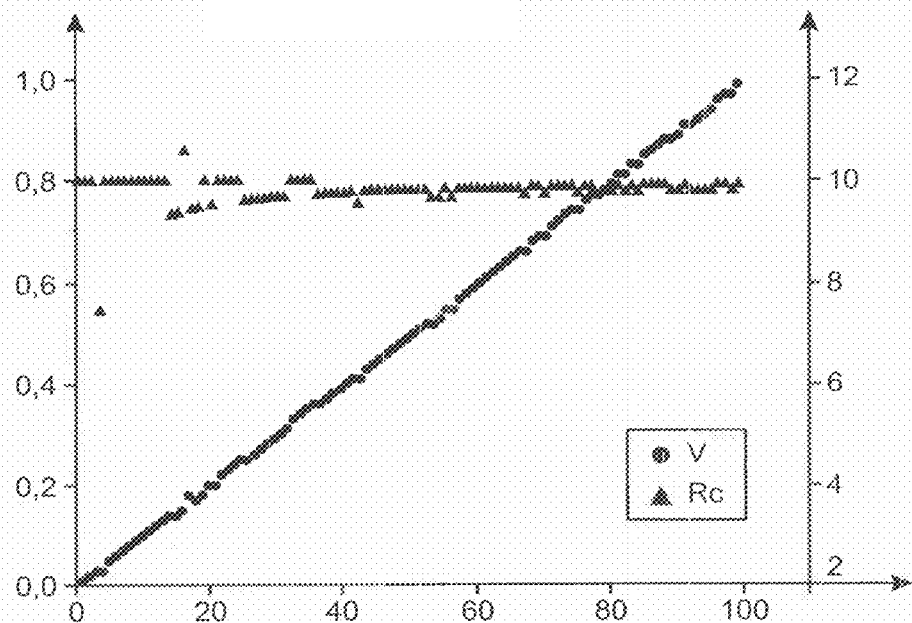
Figure 5B:
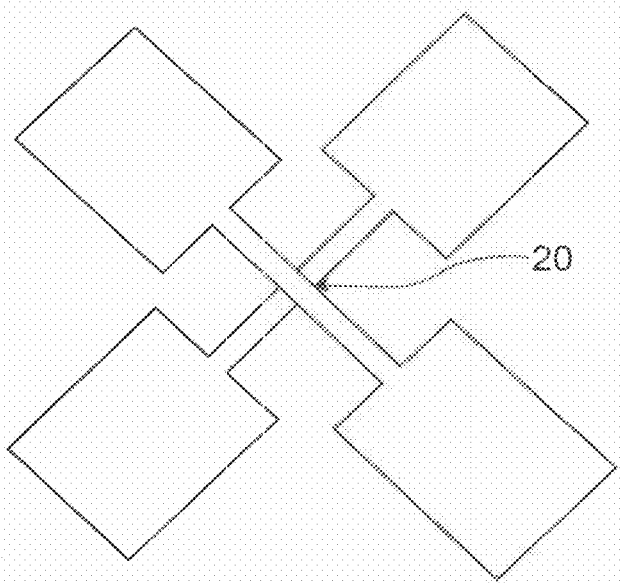
Figure 6A:
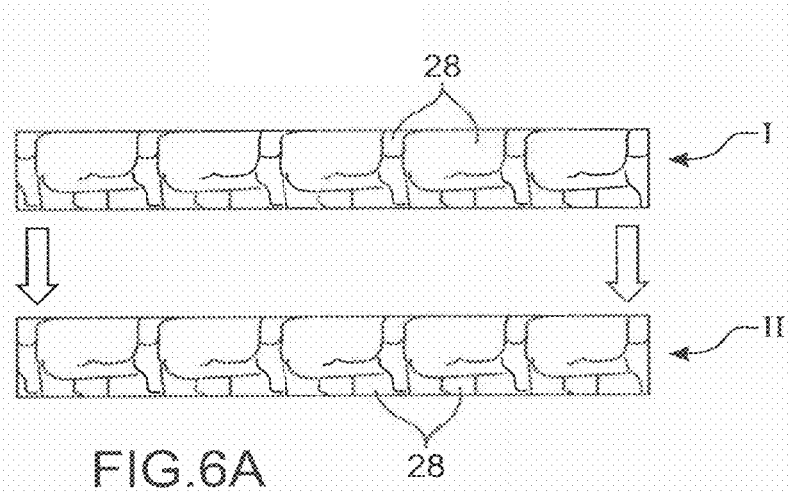
Figure 6B:
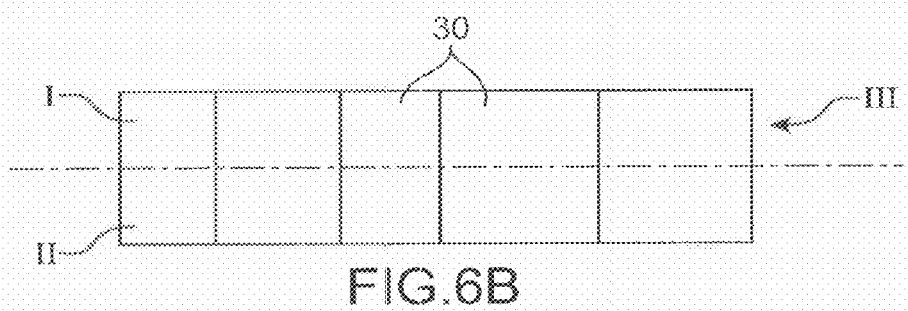
Figure 7:
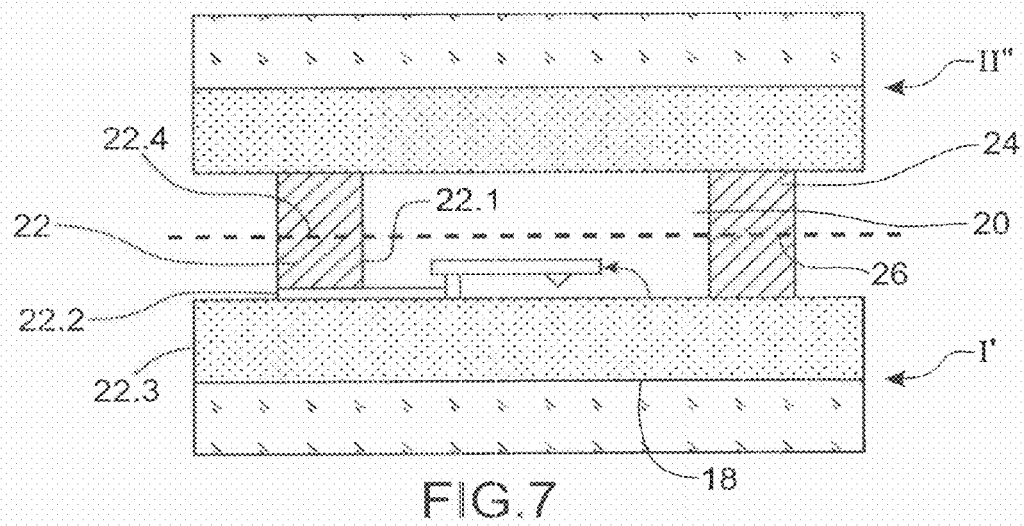

The present invention will be better understood by means of the description which follows and of the appended drawings wherein:

FIGS. 1A-1E are schematic views of the different steps of the method according to the present invention applied to bonding of structured elements, FIG. 2 is a photograph of a bonding interface obtained by the method according to the present invention before annealing, FIG. 3 is a graphic illustration of the variation in the bonding energy in $J/m^2$ of a copper plate-copper plate bond according to the present invention and of a bond of a copper plate with an $SiO_2$ plate according to the present invention versus annealing temperatures in ° C., FIG. 4 is a graphic illustration of the temperature-dependent variation in the bonding energy in $J/m^2$ of a copper-copper bond according to the present invention after 30 min annealing, and of a $SiO_2$—$SiO_2$ bond after 2 hour annealing, FIG. 5A is a graphic illustration of the variation of the voltage (in mV) versus the intensity (in mA) within a copper-copper connection obtained by the bonding method according to the invention and for determining the electric resistance (in mΩ) of this connection, FIG. 5B is a top view of the relevant connection for the measurements illustrated in FIG. 5A, FIGS. 6A and 6B are schematic illustrations of the change of the bonding interface obtained according to the present invention after annealing, FIG. 7 is a schematic illustration of a MEMS encapsulated by means of the method of the present invention.

DETAILED DISCUSSION OF PARTICULAR EMBODIMENTS

The method according to the present invention consists of achieving molecular bonding between copper elements.

Both of these elements may each be a copper plate, a copper layer or connection pads or connection lines, one face of which is flush with a substrate in an insulating material. Or further one of the elements may be a copper plate and the other element a set of pads, one face of which is flush with an insulating substrate.

Molecular bonding is understood as bonding by molecular adhesion during which two planar surfaces adhere to each other without applying any adhesive.

In FIG. 1A, a schematic illustration of one of the two elements 2, 4 to be bonded may be seen. In the illustrated example, both elements are symmetrical, as this may be seen in FIG. 1E; only one will be described in detail. Element 2 includes a substrate 6, for example in silicon covered with a layer of dielectric material 8, for example in $SiO_2$ and copper pads 10 are made in the dielectric layer 8.

In FIG. 1A which corresponds to the element before polishing, a copper layer 12 is deposited on the dielectric layer 8 and fills the recessed areas intended for the pads. In the illustrated example, an additional layer 9 forming a diffusion barrier, for example in TiN, is deposited on the dielectric layer 8 before depositing the copper layer 12.

The element 4 includes pads 14 (FIG. 1E).

The object of the method according to the present invention is to assemble both of these elements 2, 4, more particularly to bond the pads 14 onto the pads 10.

The method according to the present invention includes:

a step A) for forming a crystalline copper layer enriched in oxygen on each of the surfaces of each of the first and second elements through which the elements will be in contact, the total thickness of both layers being less than 6 nm, and a step B) for putting into contact the surfaces inducing hydrophilic molecular bonding of both elements through said surfaces at room temperature and under atmospheric pressure.

Step A) comprising:

a) a step for polishing the elements 2, 4 so as to release surfaces provided with pads 10, 14, the free faces of which 10.1, 14.1 have a roughness of less than 1 nm RMS, advantageously less or equal to 0.5 nm RMS, b) a step for cleaning said surfaces 10.1, 14.1 in order to suppress the presence of particles due to polishing. At the end of this step, the free faces 10.1, 14.1 have hydrophilic property.

For example, the thickness of the crystalline copper layer enriched in oxygen on each pad 10, 14 is comprised between the thickness of a mono-layer, i.e. of the order of 1 Å up to about 3 nm. By a crystalline copper layer enriched in oxygen is meant a crystalline copper layer including oxygen which may range from the adsorbed layer up to stoichiometric copper oxide.

In the present application, a surface is considered as hydrophilic if the contact angle is comprised between 0° and 20°, preferably as small as possible.

The different steps will be described in detail in the description which follows.

In order to carry out bonding between the copper pads, faces 10.1, 14.1 providing very great flatness are sought to be obtained so that, during their contacting, the contact between the faces is substantially perfect. For this purpose, it is sought to obtain a roughness of less than 1 nm RMS (Root Mean Square value), advantageously less than or equal to 0.5 nm RMS A polishing example is given below, but the latter is by no means limiting, and any other method may be used with which a roughness of less than 1 nm RMS may be attained.

The polishing step a) allows passing from the structure of FIG. 1A to the structure of FIG. 1D.

We shall only describe the polishing of element 2, the polishing of the element 4 being carried out in a similar way. Chemical mechanical polishing or CMP (Chemical Mechanical Polishing) is carried out in order to flatten the obtained patterns after depositing the copper layer 12 on the substrate 6.

FIGS. 1A-1D illustrate the different conditions of the element 2 during the different polishing steps.

FIG. 1 illustrates the element 2 after depositing the copper layer 12 and before beginning polishing. The dielectric 8 was etched and includes etchings 11. In the illustrated example, the dielectric 8 is covered with a diffusion barrier 9, for example TiN. The copper layer 12 includes recessed areas 13 forming steps at the etchings 11.

During a first polishing step a1), the copper layer is flattened in order to obtain the configuration of FIG. 1B, the recessed areas 13 have disappeared. For this, chemical mechanical polishing is carried out with a flattening chemical product. A chemical product or slurry is said to be <<flattening>>, when it allows a reduction of the steps present after depositing material on a structure. The remaining copper thickness is comprised between 50 nm and 200 nm.

In FIG. 1B, the layer 12 is substantially planar.

Next, during step a2) polishing is carried out for removing the copper layer on the diffusion barrier outside the etchings, until the copper in the etchings is recessed from the surface of the element 4. For this, chemical mechanical polishing is carried out with a non-flattening and selective slurry on the diffusion barrier or the dielectric, i.e. it etches the copper but not the barrier or the dielectric. By selecting this slurry, the copper in the etchings is substantially planar and is recessed in a homogeneous way from the surface of the element 4, i.e. recessed from the diffusion barrier. There is no occurrence of a dished profile. This is obtained regardless of the dimensions of the etchings. The structure of FIG. 1C is obtained. This recess may be adjusted by the polishing parameters such as the pressure exerted by the plate on the tissue or the polishing time. This recess may also be adjusted depending on the polishing chemical solution and notably with the complexing agents and/or with the corrosion inhibitors. However, it is also possible to have polishing of the barrier and selective stoppage on the dielectric.

During a next step a3), recess of the diffusion barrier and possibly of the dielectric is carried out in order to bring the surface of the barrier or of the dielectric substantially at the surface of the copper pads 10, a gap of more or less 5 nm exists, between the surface of the pads and that of the barrier or of the dielectric. For this, chemical mechanical polishing is carried out with a flattening slurry. In this step, both the copper, the dielectric and the barrier are polished at different rates. These rates are adjusted with the composition of the slurry by taking into account the materials to be polished, the widths and densities of the cavities of the wafers and the intended final topography.

When the surface of the copper pads are recessed from the surface of the barrier or from the surface of the dielectric, we can apply in advantageous manner a heat treatment after the surfaces are put into contact in order to improve the contact between surfaces of the copper pads thank to the copper dilatation.

We shall now describe in more detail the means which may be applied for carrying out chemical mechanical polishing for achieving the present invention.

The surface of the element 2 to be polished is rubbed on a tissue called a "pad" consisting of viscoelastic porous polyurethane and the properties of which (hardness, compressibility, shape and dimension of the pores as well as of the patterns . . . ) depend on the nature of the material to be polished. The material(s) at the surface of the element 2 is(are) removed by chemical reaction and mechanical action with the tissue and/or a solution containing particles, called a "slurry" (suspended particles in an acid or basic chemical solution). These slurries may consist of particles with nanometric sizes in a liquid solution (colloidal solution, micelles, Langmuir-Blodgett films, etc.).

Polishing is obtained by the combination of several actions:

a mechanical action obtained by rubbing the tissue and/or the particles of the slurry on the surface. The removal rate of the material was modelled by Preston according to the following equation:

$$RR = K_p \times P \times V \quad [1]$$

with:

RR (Removal Rate): removal rate at a given point (in nm/min), $K_p$=Preston constant taking into account the characteristics of the material, the tissue, of the type of abrasive, temperature . . . .

P=Applied pressure (in Newtons),

V=Linear velocity of one point of the wafer relatively to the tissue (in m/s), chemical action; during polishing, it is desired to both polish copper and the dielectric material. The slurries are therefore adapted so as to have a chemical action on the copper and on the dielectric material. As regards copper, the chemical action generally stems from etching with an acid and/or an oxidizer allowing reaction with the surface to be polished.

Generally, a slurry is formed by the presence of a chemical metal-etching agent, of an oxidizer (generally $H_2O_2$), of a pH stabilizer added to the acid or basic solution of the slurry and of a corrosion inhibitor. The chemical solution will passivate (K1) the material by forming at its surface a metal oxide which will be removed mechanically (K2) by the tissue and by the possible particles of the slurry. The chemical solution will then form $CuO_x$.

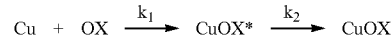

This chemical reaction facilitates and accelerates the polishing mechanism. Other chemical reactions may be generated by the formation of soluble metal cations, copper/copper or copper/$Cu^{2+}$ and removed from the surface to be polished by the tissue and/or the particles of the slurry.

For the dielectric material, the slurries generally used are aqueous solutions. Water has great significance for dielectric polishing, for example of silicon oxide. Two chemical reactions are involved.

First of all, water penetrates under the effect of pressure and breaks certain Si—O bonds of silicon oxide in order to form a hydrated surface. Separation of the bonds (Si—O—Si) is controlled by the diffusion of water into the silica. Polishing is achieved when the following reversible hydration reaction (polymerization):

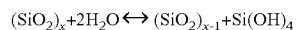

may occur in the reverse direction, i.e. in the direction of hydration (de-polymerization), as this notably described in the book, "*Handbook of Semiconductor Interconnection Technology*" by G C Schwarz.

The movement of the tissue relatively to the silicon wafer then allows the slurry particles to be removed from the surface thereby carrying away atoms from the surface material.

In order to carry out chemical etching of both copper and the dielectric material, an aqueous solution may be used, obtained by solubilization in deionized water:

- of one or two complexing agents or for chemical etching of metals and of possible metal compounds (glycine, $NH_3$, EDTA, etc.) which allows an increase in the polishing rate of the copper,
- of a copper corrosion inhibitor (benzotriazole BTA, triazole TA . . . ), an agent which passivates the copper film, reduces the polishing rates specifically in the low areas to be flattened. Often two inhibitors are used,
- of a surfactant for stabilizing the pH, improving selectivity of copper polishing towards the other materials used.
- of an oxidizing agent ($H_2O_2$, $KIO_3$, hydroxylamine, etc. . . . ) which according to the pH and/or its concentration, may either form passivation of the copper by an insoluble copper oxide or hydroxide, or corrosion by a metal cation that is soluble in the aqueous solution,
- of anionic or cationic colloidal particles, having a pH comprised between 1 and 12 which are advantageously added in order to obtain a stable suspension of particles. The particles may be pure such as silica, carbon, cerium oxide, alumina or polymers. The sizes of the elementary particles will be determined by the selected dissolution method. They may vary from 3 nm to 300 nm. The mass percentage of particles in the aqueous solution may be comprised between a few ppm and 50%.

As an example, the following aqueous solutions may be used:

- for step a1), the slurry EPL2361 sold by CMC (Cabot Microelectronics Corporation), or CoppeReady®CU3900 of DANM (Dupont Air Product Nanomaterials L.L.C) may be used,
- for step a2), the DP510 slurry of DANM or RL3000 of Rohm & Haas, or HS-C930-3 of Hitachi or C7092 of CMC may be used,
- for step a3), the CuS-1351 slurry of Rohm & Haas, or B8500 of CMC, or DP6545 of DANM, or T815 of Hitachi, or FCB-837 of Fujimi Corporation, may be used.

The characteristics of the polishing tissues used notably depend on the dimensions of the cavities etched in an insulating material and filled with copper with or without a diffusion barrier or adhesion layer.

As an example, for cavities with a width greater than 10 μm, so-called flattening tissues in polyurethane are selected with a hardness classified as <<Shore D>> from 50 to 70, with a density of 60 to 90 mg/cm$^3$, and compressibility of less than 4%, for example IC1000 of Rohm & Haas, or D100 of CMC.

For cavities smaller than 10 μm, so-called medium tissues may for example be selected, with a hardness classified as <<Shore A>> from 50 to 70, with a density from 20 to 40 mg/cm$^3$, and compressibility between 10 and 25%, for this application, for example Suba IV of Rohm & Haas.

For cavities of the order of one micrometer, as certain ductile materials risk being scratched by the particles, so-called finishing polishing tissues are preferred, with hardness classified as <<Shore A>> from 50 to 80, with a density <20 mg/cm$^3$, and a compressibility >30%, for example POLITEX® of Rohm & Haas, or tissues of the Fujibo® brand.

The elements are for example treated on standard polishers for example of the types Mirra or Reflexion from Applied Materials USA, Megapol M550 from Alpsitec France or FREX from Ebara Japan.

The polishing parameters are the pressure exerted on the substrate comprised between 0.02 daN/cm$^2$ to 1 daN/cm$^2$, the velocity of a point of the substrate relatively to a point of the tissue is comprised between 0.1 m/s to 3 m/s, the flow rate of the aqueous solution between 5 and 300 ml for substrates varying from 1 to 450 mm, the temperature being comprised between 2 and 70° C. Preferentially, the conditions for the aforementioned applications are 0.1 daN/cm$^2$, with a velocity of 1 m/s, an aqueous solution flow rate of 150 ml for substrates of 200 mm at a temperature of 52° C.

During step b), both elements, more particularly the faces of two elements, intended to be put into contact, are rinsed in order to suppress the residual particles which may have remained following polishing, as well as the copper corrosion inhibitors. Rinsing is carried out, for example by means of an alkaline solution.

The thereby formed surfaces have strong hydrophilic property.

After step b), each of the faces of the elements to be put into contact with each other include a crystalline copper layer enriched in oxygen. The oxygen-enriched crystalline copper layer is present on the free faces 14.1, 16.1 of the pads. This layer is formed by putting free faces into contact with an oxidizing atmosphere.

The time which elapses before the putting into contact is under control in this step so that the total thickness of the oxygen-enriched crystalline copper layer formed by the two layers borne by each of the elements, during the putting into contact of both surfaces, is less than 6 nm. For example, an oxide layer comprised between a thickness of 1 Å (i.e. of the order of a monolayer) and 3 nm is sought to be obtained, on each of the pads.

The maximum time between the end of the cleaning and the putting into contact is advantageously of about 2 hours. Beyond this time, the free faces may no longer have hydrophilic property.

It is possible to prepare the surfaces again in order to make them suitable for bonding.

For this, the oxygen-enriched copper layer(s) is(are) removed by means of a plasma while making sure not to increase the roughness of the surface(s). The surfaces are then ready for a new step for forming oxygen-enriched crystalline copper.

Preferably, this is a He/$H_2$ plasma, which has the advantage of only etching the oxygen-enriched copper layer and of not modifying the roughness of the copper layer. The action of such a plasma is for example described in document "*Reduction of CuO and Cu$_2$O with H$_2$: Embedding and Kinetic Effects in the Formation of Suboxides*", Jae Y. Kim et al., in *JACS* 2003, pages 10684-10692.

At the end of this step, both elements, more particularly the free faces of the pads 10.1, 14.1, are ready to be put into contact with each other in order to achieve molecular bonding.

The faces 10.1, 14.1 are put into contact, each face 14.1 of a pad of one element being aligned with a face 10.1 of a pad of the other element.

The contacting is advantageously carried out at room temperature and under atmospheric pressure at room temperate and under air at atmospheric pressure.

By simply putting them into contact, it is possible to obtain bonding of both faces. An assembly is then obtained having very good electric conductivity between the first and the second element and very good mechanical strength.

Provision may be made for initiating the bonding by applying a slight pressure to one end of the assembly. This force is exerted at the beginning and does not need to be maintained during the whole bonding. This slight pressure brings both surfaces closer and accelerates the bonding. For example, the bonding of an 8 inch surface may be effective in less than one minute.

This pressure is advantageously exerted at a point of the edge of the upper wafer, which avoids the occurrence of two propagations and the risks of occurrence of a non-bonded area when both propagations encounter each other.

Annealing of the thereby formed assembly may be carried out. The oxygen-enriched crystalline copper layer <<dissolves>>, the oxygen is grouped as an <<islet>> preferentially at the interface defects, for example towards cavities induced by the migration of vacancies or towards roughness remnants, for example every 100 nm. These cavities do not interfere with electric conductivity, or with mechanical strength. Apart from the cavities, a copper-copper contact is obtained.

Provision may be made for applying elements for which the crystallographic orientation of the copper is determined. For example, it is possible to select that the dense plane is parallel to the interface, i.e. the (111) planes parallel to the bonding interface are oriented. It is observed that the oxygen of the copper oxide is then confined to the interface and does not diffuse into the copper elements.

By means of the present invention, the bonding of two copper elements is achieved in a very simple and very effective way.

In FIG. 2, the photograph of the copper-copper bonding interface according to the present invention may be seen before annealing, the scale on the right-hand side indicates the total thickness of the oxygen-enriched crystalline copper layer.

In FIG. 3, the variation of the bonding energy in $J/m^2$ between two elements is illustrated versus annealing temperatures in ° C., the annealing time being 30 min, the solid line curve illustrates the time-dependent change of the bonding energy for a (copper wafer)-(copper wafer) bonding according to the present invention, the dotted line curve illustrates the temperature-dependent variation of the bonding energy of a bond of a copper wafer with an $SiO_2$ wafer. The measurements are carried out by DCB (Double Cantilever Beam) and by acoustic imaging. It is noted that the bonding according to the present invention provides greater bonding energy regardless of the annealing temperature and even in the absence of annealing (at 25° C.).

FIG. 4 illustrates the variation of the bonding energy in $J/m^2$ between two solid wafer elements versus annealing temperatures in ° C. as determined by the DCB method and by acoustic imaging, the thin line curve illustrates the time-dependent change in the bonding energy for copper-copper bonding according to the present invention after 30 min annealing, the thick line curve illustrates the temperature-dependent variation in the bonding energy of a $SiO_2$—$SiO_2$ bond after 2 hours annealing. It is noted that the bonding according to the present invention provides greater bonding energy regardless of the annealing temperature. The dotted line curve illustrates the temperature-dependent change in the bonding energy by copper-copper bonding according to the present invention as measured by the so-called <<Four Point Bending>> method. Beyond annealing at 100° C., the bonding energy is too strong to be measured.

FIG. 5A illustrates the voltage variation in mV versus the current in mA flowing through a copper-copper connection 20 obtained by bonding according to the present invention illustrated in FIG. 5B. The copper-copper contact surface area is 100 $\mu m^2$. The connection was subject to 30 min annealing at 200° C. Triangles illustrate the electric resistance in m$\Omega$ of this connection. The resistance of this connection is 9.8 m$\Omega$, which corresponds to electric conductivity specific to the contact of 0.98 $\Omega \cdot \mu m^2$. It is thus seen that the copper-copper connection according to the present invention provides very good electric conductivity.

The method according to the present invention provides the advantage of being applicable to wafer-wafer or chip-wafer bonding.

As the method according to the present invention is carried out at room temperature, it is possible to achieve bonding on an implanted wafer.

As described earlier, the thereby formed assembly may be subject to an annealing step; the effect of such annealing on the bonding interface between two elements I, II may be seen in FIGS. 6A and 6B.

The elements I, II both have small grains 28.

After the bonding according to the present invention, annealing is applied to both bonded elements I, II', forming an element III. Restoration occurs, causing the formation of large grains 30 in both bonded elements I, II and the <<disappearance>> of the bonding interface.

This homogeneous restoration into large grains improves the mechanical strength of the assembly and the electric conductivity between both elements I, II, because of the disappearance of the bonding interface.

For example, the lines measure at least 10 nm in width.

The restoration annealing temperature depends on the processed substrate on which the copper lines are made, the annealing temperature is comprised between 200° C. and 400° C. The duration of the annealing depends on the annealing temperature, the higher the temperature, the more the duration of the annealing may be reduced.

The bonding method according to the present invention advantageously allows encapsulation of electromechanical microsystems or of MEMS (microelectromechanical systems), actuators or sensors in a cavity hermetically sealed off from gas and humidity, so as for example to limit its ageing or increase the reliability of the measurements.

According to the present invention and as this is illustrated in FIG. 7, a first element I' is made on which an MEMS 18 is formed and a second element II' is made for delimiting with the first element a hermetically sealed cavity 20 in which the MEMS 18 is encapsulated.

For this, the first elements I' includes a first wall 22 surrounding the MEMS 18 so as to form a closed contour around the MEMS 18. The first wall for example has the shape of a crown. The first wall 22 includes an inner side face 22.1, an outer side face 22.2, a bottom 22.3 in contact with the first element I' and a top 22.4, the top 22.4 forms a flat face.

The second element II' includes a second copper wall 24 with shape and dimensions similar to those of the first wall 22, including a top 26 forming a flat face.

The sum of the heights of the first and of the second wall is greater than or equal to the height of the MEMS 18, avoiding mechanical interaction between the MEMS 18 and the walls of the cavity.

The planar faces 22.4 and 26 are prepared according to steps a), b) and c), and are then put into contact with each other according to step d).

A single sealed wall 28 is then obtained, defining with both elements I', II' a sealed cavity.

A direct copper-copper bond at room temperature and at atmospheric pressure is then obtained, as described earlier. There is therefore no risk of damaging the MEMS.

It may be desirable to control the atmosphere inside the cavity, for example with a neutral gas with which any chemical reaction may be avoided and the cavity may be sealed in a more or less high vacuum. It is then easy, by means of the seal according to the present invention, to control this atmosphere.

The vacuum within the cavity may be applied after the bonding or, advantageously, the under vacuum contacting step d) is carried out, which simplifies the sealing method.

The obtained seal is of very good quality, both from the mechanical point of view, and from the sealing point of view.

Further, the wall 28 is electrically conducting, which allows powering of the MEMS as this is schematized in FIG. 6 through the connection 30.

The walls 22, 24 are made by standard microelectronic methods.

This encapsulation method is particularly advantageous with view to the other methods of the state of the art. Indeed, the suitable surface technologies, known under the name of <<thin layer packaging>>, do not give the possibility of obtaining a very good vacuum or a controlled atmosphere in the cavity.

The technology consisting of transferring a cover by a hermetic seal around the microsystem (<<waferlevel-packaging>>) requires a polymer adhesive, which has poor performances as regards hermeticity.

By means of the method according to the present invention, bonding between two copper elements at atmospheric pressure and at room temperature is achieved. This bond has great mechanical strength and very good electric conduction properties.

The invention claimed is:

1. A method for bonding a first copper element onto a second copper element comprising:
    A) forming a crystalline copper layer enriched in oxygen on each of surfaces of each of the first and second elements through which the elements will be in contact, a total thickness of both layers being less than 6 nm;
    B) putting both crystalline copper layers enriched in oxygen in contact with each other;
    the A) forming the crystalline copper layer comprising:
        a) polishing the surfaces of each of the first and second elements so as to obtain a roughness of less than 1 nm RMS, and hydrophilic surfaces;
        b) cleaning the surfaces of each of the first and second elements to suppress presence of particles due to the polishing and a major portion of corrosion inhibitors,
    wherein B) takes place at room temperature, at atmospheric pressure, and in air.

2. A method for bonding a first copper element onto a second copper element according to claim 1, wherein the roughness is less than 0.5 nm RMS.

3. A method for bonding a first copper element onto a second copper element according to claim 1, wherein B) takes place within two hours following b).

4. A method for bonding a first copper element onto a second copper element according to claim 1, further comprising applying a force on one of the first and second copper elements tending to bring both crystalline copper layers enriched in oxygen closer to each other so as to initiate bonding.

5. A method for bonding a first copper element onto a second copper element according to claim 4, wherein the applying the force takes place only on one edge of one of the first and second copper elements.

6. A method for bonding a first copper element onto a second copper element according to claim 1, wherein dense planes of the first and second copper elements are oriented substantially parallel to the bonding surfaces.

7. A method for bonding a first copper element onto a second copper element according to claim 1, the first and second copper elements including a substrate, a dielectric layer provided with etchings, deposited on the substrate, a copper layer covering the dielectric and filling the etchings of the dielectric layer, the copper layer including steps at the etchings, in which a) includes the following:
    a1) chemical mechanical polishing of the copper layer of each element with a leveling chemical solution until the steps disappear and a substantially planar copper surface is obtained;
    a2) chemical mechanical polishing of the remaining copper layer with a selective non-leveling chemical solution relatively to the dielectric until the copper on the dielectric layer apart from the etchings is completely removed, the copper remaining at the same level as the dielectric or set back from the surface of the dielectric; and
    a3) chemical mechanical polishing of the dielectric with a leveling chemical solution until the surface of the dielectric is substantially at the surface of the pads.

8. A method for bonding a first copper element onto a second copper element according to claim 7, wherein the first and second copper elements include a diffusion barrier between the dielectric and the copper layer, during a2), the copper layer is polished until it disappears on the diffusion barrier apart from etchings, and during a3), the diffusion barrier is polished before the dielectric or instead of the dielectric.

9. A method for bonding a first copper element onto a second copper element according to claim 1, further comprising C) an additional annealing after B).

10. A method for bonding a first copper element onto a second copper element according to claim 1, wherein the first element is in a form of a copper plate or of pads flush with a surface of a dielectric material and the second element is in a form of a plate or of pads flush with a dielectric material surface.

11. A method for making a microelectronic device including an electromechanical microsystem structure in a hermetically sealed cavity, comprising:
    making a first element including an electromechanical microsystem structure surrounded by a first copper wall forming a closed contour, the top of a first wall being formed by a planar surface;
    making a second element including a second wall, the top of which is formed by a planar face with shape and dimensions similar to that of the first wall of the first element, the sum of the heights of the first and second walls being greater than the height of the electromechanical microsystem structure;
    polishing the planar faces of the walls of each of the first and second elements through which the elements will be in contact so as to obtain a roughness of less than 1 nm RMS, or less than or equal to 0.5 nm RMS;
    cleaning the faces in order to suppress presence of particles due to the polishing and of corrosion inhibitors;
    contacting with oxygen and for forming a crystalline copper layer enriched in oxygen on each of the planer faces, the total thickness of both layers being less than 6 nm; and
    putting both oxygen-enriched crystalline copper layers in contact with each other so as to seal the electromechanical microsystem structure in a sealed cavity delimited by the first and second elements and the first and second walls at room temperature, at atmospheric pressure, and in air.

12. A method for making a microelectronic device according to claim 11, further comprising controlling the atmosphere within the thereby formed cavity.

13. A method for making a microelectronic device including an electromechanical microsystem structure in a hermetically sealed cavity, comprising:

making a first element including an electromechanical microsystem structure surrounded by a first copper wall forming a closed contour, the top of a first wall being formed by a planar surface;

making a second element including a second wall, the top of which is formed by a planar face with shape and dimensions similar to that of the first wall of the first element, the sum of the heights of the first and second walls being greater than the height of the electromechanical microsystem structure;

polishing the planar faces of the walls of each of the first and second elements through which the elements will be in contact so as to obtain a roughness of less than 1 nm RMS, or less than or equal to 0.5 nm RMS;

cleaning the faces in order to suppress presence of particles due to the polishing and of corrosion inhibitors;

contacting with oxygen and for forming a crystalline copper layer enriched in oxygen on each of the planer faces, the total thickness of both layers being less than 6 nm; and putting both oxygen-enriched crystalline copper layers in contact with each other, within two hours following the cleaning of the faces, so as to seal the electromechanical microsystem structure in a sealed cavity delimited by the first and second elements and the first and second walls, wherein the contacting is carried out under vacuum.

14. A method for bonding a first copper element onto a second copper element comprising:
A) forming a crystalline copper layer enriched in oxygen on each of surfaces of each of the first and second elements through which the elements will be in contact, a total thickness of both layers being less than 6 nm; and
B) putting both crystalline copper layers enriched in oxygen in contact with each other under vacuum,
the A) forming the crystalline copper layer comprising:
a) polishing the surfaces of each of the first and second elements so as to obtain a roughness of less than 1 nm RMS, and hydrophilic surfaces; and
b) cleaning the surfaces of each of the first and second elements to suppress presence of particles due to the polishing and a major portion of corrosion inhibitors, and
the B) putting both crystalline copper layers enriched in oxygen in contact with each other comprising:
applying a force on one of the first and second copper elements tending to bring both crystalline copper layers enriched in oxygen closer to each other so as to initiate bonding, wherein the applying the force takes place only on one edge of one of the first and second copper elements.

15. A method for bonding a first copper element onto a second copper element comprising:
A) forming a crystalline copper layer enriched in oxygen on each of surfaces of each of the first and second elements through which the elements will be in contact, a total thickness of both layers being less than 6 nm; and
B) putting both crystalline copper layers enriched in oxygen in contact with each other under vacuum,
the A) forming the crystalline copper layer comprising:
a) polishing the surfaces of each of the first and second elements so as to obtain a roughness of less than 1 nm RMS, and hydrophilic surfaces; and
b) cleaning the surfaces of each of the first and second elements to suppress presence of particles due to the polishing and a major portion of corrosion inhibitors,
wherein dense planes of the first and second copper elements are oriented substantially parallel to the bonding surfaces.

* * * * *